United States Patent
Yuan et al.

(10) Patent No.: US 7,431,967 B2
(45) Date of Patent: Oct. 7, 2008

(54) LIMITED THERMAL BUDGET FORMATION OF PMD LAYERS

(75) Inventors: Zheng Yuan, Fremont, CA (US);
Shankar Venkataraman, Santa Clara, CA (US); Cary Ching, Sunnyvale, CA (US); Shang Wong, Cupertino, CA (US); Kevin Mikio Mukai, Santa Clara, CA (US); Nitin K. Ingle, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 500 days.

(21) Appl. No.: 10/757,770

(22) Filed: Jan. 14, 2004

(65) Prior Publication Data

US 2004/0166695 A1     Aug. 26, 2004

Related U.S. Application Data

(63) Continuation-in-part of application No. 10/247,672, filed on Sep. 19, 2002, now Pat. No. 6,905,940.

(51) Int. Cl.
*C23C 16/00* (2006.01)
*C23C 14/00* (2006.01)
*C23C 16/22* (2006.01)
*H01L 21/302* (2006.01)
*H01L 21/461* (2006.01)

(52) U.S. Cl. ............... 427/255.28; 427/255.23; 427/255.26; 427/255.38; 438/738

(58) Field of Classification Search ............ 427/255.23, 427/255.26, 255.38; 438/738
See application file for complete search history.

(56) References Cited

U.S. PATENT DOCUMENTS 2,861,009 A    11/1958  Rubner (Continued)

FOREIGN PATENT DOCUMENTS

CA    479107    12/1951

(Continued)

OTHER PUBLICATIONS

Romanelli, Alex Semiconductor International website article: AMD Details 45nm Technology, at www.e-insite.net/semiconductor/; Jun. 12, 2003.

(Continued)

*Primary Examiner*—Timothy Meeks
*Assistant Examiner*—Kelly M Stouffer
(74) *Attorney, Agent, or Firm*—Townsend and Townsend and Crew LLP

(57) ABSTRACT

A method of filling a gap on a substrate includes providing flows of silicon-containing processing gas oxidizing processing gas, and phosphorous-containing processing gas to a chamber housing the substrate and depositing a first portion of a P-doped silicon oxide film as a substantially conformal layer in the gap by causing a reaction among the processing gases and varying over time a ratio of the gases. The temperature of the substrate is maintained below about 500° C. throughout deposition of the conformal layer. The method also includes depositing a second portion of the P-doped silicon oxide film as a bulk layer by maintaining the ratio of the gases substantially constant throughout deposition of the bulk layer. The temperature of the substrate is maintained below about 500° C. throughout deposition of the bulk layer.

28 Claims, 7 Drawing Sheets

U.S. PATENT DOCUMENTS

| | | |
|---|---|---|
| 2,889,704 A | 8/1959 | Pekarek |
| 3,046,177 A | 7/1962 | Hankins |
| 3,048,888 A | 8/1962 | Shockley et al. |
| 3,109,703 A | 11/1963 | Politzer et al. |
| 3,142,714 A | 7/1964 | Politzer et al. |
| 3,166,454 A | 1/1965 | Voelker |
| 4,297,162 A | 10/1981 | Mundt et al. |
| 4,590,042 A | 5/1986 | Drage |
| 4,732,761 A | 3/1988 | Machida et al. |
| 4,792,378 A | 12/1988 | Rose et al. |
| 4,854,263 A | 8/1989 | Chang et al. |
| 4,892,753 A | 1/1990 | Wang et al. |
| 4,962,063 A | 10/1990 | Maydan et al. |
| 4,989,541 A | 2/1991 | Mikoshiba et al. |
| 5,051,380 A * | 9/1991 | Maeda et al. ............... 438/761 |
| 5,089,442 A | 2/1992 | Olmer |
| 5,124,014 A | 6/1992 | Foo et al. |
| 5,204,288 A | 4/1993 | Marks et al. |
| 5,244,841 A | 9/1993 | Marks et al. |
| 5,264,040 A | 11/1993 | Geyling et al. |
| 5,314,845 A * | 5/1994 | Lee et al. ..................... 438/763 |
| 5,356,722 A | 10/1994 | Nguyen et al. |
| 5,439,524 A | 8/1995 | Cain et al. |
| 5,474,955 A | 12/1995 | Thakur |
| 5,492,858 A | 2/1996 | Bose et al. |
| 5,567,267 A | 10/1996 | Kazama et al. |
| 5,589,002 A | 12/1996 | Su |
| 5,597,439 A | 1/1997 | Salzman |
| 5,660,472 A | 8/1997 | Peuse et al. |
| 5,710,079 A | 1/1998 | Sukharev |
| 5,728,223 A | 3/1998 | Murakami et al. |
| 5,728,260 A | 3/1998 | Brown et al. |
| 5,789,322 A | 8/1998 | Brown et al. |
| 5,807,785 A | 9/1998 | Ravi |
| 5,812,403 A | 9/1998 | Fong et al. |
| 5,840,631 A | 11/1998 | Kubo et al. |
| 5,939,763 A | 8/1999 | Hao et al. |
| 5,965,203 A * | 10/1999 | Gabric et al. .......... 427/255.23 |
| 5,976,261 A | 11/1999 | Moslehi et al. |
| 5,980,686 A | 11/1999 | Goto |
| 6,001,175 A | 12/1999 | Maruyama et al. |
| 6,013,584 A * | 1/2000 | M'Saad ....................... 438/783 |
| 6,024,799 A | 2/2000 | Chen et al. |
| 6,043,136 A | 3/2000 | Jang et al. |
| 6,050,506 A | 4/2000 | Guo et al. |
| 6,079,353 A | 6/2000 | Leksell et al. |
| 6,079,356 A | 6/2000 | Umotoy et al. |
| 6,099,647 A | 8/2000 | Yieh et al. |
| 6,106,663 A | 8/2000 | Kuthi et al. |
| 6,106,678 A | 8/2000 | Shufflebotham et al. |
| 6,133,160 A | 10/2000 | Komiyama et al. |
| 6,136,685 A | 10/2000 | Narwankar et al. |
| 6,140,242 A | 10/2000 | Oh et al. |
| 6,149,987 A | 11/2000 | Perng et al. |
| 6,150,209 A | 11/2000 | Sun et al. |
| 6,150,286 A | 11/2000 | Sun et al. |
| 6,156,114 A | 12/2000 | Bell et al. |
| 6,171,901 B1 | 1/2001 | Blair et al. |
| 6,184,155 B1 | 2/2001 | Yu et al. |
| 6,190,973 B1 | 2/2001 | Berg et al. |
| 6,194,038 B1 | 2/2001 | Rossman |
| 6,197,705 B1 | 3/2001 | Vassiliev |
| 6,203,863 B1 | 3/2001 | Liu et al. |
| 6,206,972 B1 | 3/2001 | Dunham |
| 6,217,658 B1 | 4/2001 | Orczyk et al. |
| 6,218,268 B1 * | 4/2001 | Xia et al. ..................... 438/435 |
| 6,232,580 B1 | 5/2001 | Sandhu |
| 6,236,105 B1 * | 5/2001 | Kariya ........................ 257/634 |
| 6,239,002 B1 | 5/2001 | Jang et al. |
| 6,245,192 B1 | 6/2001 | Lenz et al. |
| 6,245,689 B1 | 6/2001 | Hao et al. |
| 6,248,397 B1 | 6/2001 | Ye |
| 6,248,628 B1 | 6/2001 | Halliyal et al. |
| 6,267,074 B1 | 7/2001 | Okumura |
| 6,276,072 B1 | 8/2001 | Morad et al. |
| 6,302,965 B1 | 10/2001 | Umotoy et al. |
| 6,319,849 B1 | 11/2001 | Oda et al. |
| 6,331,494 B1 | 12/2001 | Olson et al. |
| 6,337,256 B1 | 1/2002 | Shim |
| 6,340,435 B1 | 1/2002 | Bjorkman et al. |
| 6,348,421 B1 | 2/2002 | Shu et al. |
| 6,436,193 B1 | 8/2002 | Kasai et al. |
| 6,444,039 B1 | 9/2002 | Nguyen et al. |
| 6,454,860 B2 | 9/2002 | Metzner et al. |
| 6,468,853 B1 | 10/2002 | Balasubramanian et al. |
| 6,475,284 B1 | 11/2002 | Moore et al. |
| 6,479,405 B2 | 11/2002 | Lee et al. |
| 6,489,254 B1 | 12/2002 | Kelkar et al. |
| 6,500,771 B1 * | 12/2002 | Vassiliev et al. ............ 438/783 |
| 6,512,264 B1 | 1/2003 | Ogie, Jr. et al. |
| 6,527,910 B2 | 3/2003 | Rossman |
| 6,541,367 B1 | 4/2003 | Mandal |
| 6,541,401 B1 | 4/2003 | Herner et al. |
| 6,565,661 B1 | 5/2003 | Nguyen et al. |
| 6,583,069 B1 | 6/2003 | Vassilev et al. |
| 6,586,886 B1 | 7/2003 | Katz et al. |
| 6,602,792 B2 | 8/2003 | Hsu |
| 6,617,259 B2 | 9/2003 | Jung et al. |
| 6,624,091 B2 | 9/2003 | Yuan |
| 6,677,712 B2 | 1/2004 | Katz et al. |
| 6,713,127 B2 | 3/2004 | Subramony et al. |
| 6,733,955 B1 | 5/2004 | Geiger et al. |
| 6,734,115 B2 | 5/2004 | Cheung et al. |
| 6,740,601 B2 | 5/2004 | Tan et al. |
| 6,793,733 B2 | 9/2004 | Janakiraman et al. |
| 6,830,624 B2 | 12/2004 | Janakiraman et al. |
| 6,875,558 B1 | 4/2005 | Gaillard et al. |
| 6,905,940 B2 | 6/2005 | Ingle et al. |
| 6,943,091 B2 | 9/2005 | Yu et al. |
| 6,946,358 B2 | 9/2005 | Doris et al. |
| 6,949,447 B2 | 9/2005 | Ahn et al. |
| 7,037,859 B2 | 5/2006 | Ingle et al. |
| 7,141,483 B2 | 11/2006 | Yuan et al. |
| 7,208,425 B2 | 4/2007 | Ingle et al. |
| 7,335,609 B2 | 2/2008 | Ingle et al. |
| 2001/0019860 A1 | 9/2001 | Adachi et al. |
| 2002/0000195 A1 | 1/2002 | Bang et al. |
| 2002/0000196 A1 | 1/2002 | Park |
| 2002/0004282 A1 | 1/2002 | Hong |
| 2002/0006729 A1 | 1/2002 | Geiger et al. |
| 2002/0007790 A1 | 1/2002 | Park |
| 2002/0011215 A1 | 1/2002 | Tel et al. |
| 2002/0050605 A1 * | 5/2002 | Jenq ........................... 257/200 |
| 2002/0052128 A1 | 5/2002 | Yu et al. |
| 2002/0102358 A1 | 8/2002 | Das et al. |
| 2002/0168840 A1 | 11/2002 | Hong et al. |
| 2002/0192370 A1 | 12/2002 | Metzner et al. |
| 2003/0019428 A1 | 1/2003 | Ku et al. |
| 2003/0022523 A1 | 1/2003 | Irino et al. |
| 2003/0054670 A1 | 3/2003 | Wang et al. |
| 2003/0057432 A1 | 3/2003 | Gardner et al. |
| 2003/0071304 A1 | 4/2003 | Ogie, Jr et al. |
| 2003/0073290 A1 | 4/2003 | Ramkumar et al. |
| 2003/0089314 A1 | 5/2003 | Matsuki et al. |
| 2003/0104677 A1 | 6/2003 | Park et al. |
| 2003/0111961 A1 | 6/2003 | Katz et al. |
| 2003/0138562 A1 | 7/2003 | Subramony et al. |
| 2003/0140851 A1 | 7/2003 | Lund |
| 2003/0168006 A1 | 9/2003 | Williams |
| 2003/0201723 A1 | 10/2003 | Katz et al. |
| 2003/0207530 A1 | 11/2003 | Yu et al. |
| 2003/0209323 A1 | 11/2003 | Yokogaki |
| 2004/0003873 A1 | 1/2004 | Chen et al. |
| 2004/0018699 A1 | 1/2004 | Boyd et al. |

| | | | |
|---|---|---|---|
| 2004/0060514 A1 | 4/2004 | Janakiraman et al. |
| 2004/0083964 A1 | 5/2004 | Ingle et al. |
| 2004/0161903 A1 | 8/2004 | Yuan et al. |
| 2004/0200499 A1 | 10/2004 | Harvey et al. |
| 2004/0216844 A1 | 11/2004 | Janakiraman et al. |
| 2004/0224537 A1 | 11/2004 | Lee et al. |
| 2005/0064730 A1 | 3/2005 | Ingle et al. |
| 2005/0186755 A1 | 8/2005 | Smythe et al. |
| 2006/0030165 A1 | 2/2006 | Ingle et al. |
| 2006/0046427 A1 | 3/2006 | Ingle et al. |
| 2006/0148273 A1 | 7/2006 | Ingle et al. |

FOREIGN PATENT DOCUMENTS

| | | |
|---|---|---|
| EP | 0520519 A1 | 12/1992 |
| JP | 01283375 A | 11/1989 |
| JP | 01294868 A | 11/1989 |
| JP | 4154116 A | 5/1992 |
| JP | 11176593 A | 7/1999 |
| TW | 479315 | 3/2002 |
| TW | 479315 A | 3/2002 |
| WO | WO 9925895 A1 | 5/1999 |
| WO | WO 00/77831 A2 | 12/2000 |

OTHER PUBLICATIONS

Applied Materials Website Printout: "SACVD (Sub-Atmospheric Chemical Vapor Deposition)" from www.appliedmaterials.com/products/sacvd.html, printed Jun. 20, 2003.

Baker, F. et al. "STI TEOS Densification for Furnaces and RTP Tools" 1999 IEEE/SEMI Advanced Semiconductor Manufacturing Conference, 1999, pp. 394-399.

Definitions of "furnace", Merriam-Webster Online, 2006.

Fujino, K. et al., "Dependence Of Deposition Characteristics On Base Materials In TEOS And Ozone CVD At Atmospheric Pressure," J. Electrochem. Soc., vol. 138, No. 2, pp. 550-554, Feb. 1991.

Kuo, Yue, "Etch Mechanism In The Low Refractive Index Silicon Nitride Plasma-Enhanced Chemical Vapor Deposition Process," Appl. Phys. Lett., vol. 63, No. 2, pp. 144-146, Jul. 12, 1993.

Kwok, K. et al., "Surface Related Phenomena In Integrated PECVD/Ozone-TEOS SACVD Processes For Sub-Half Micron Gap Fill: Electrostatic Effects," J. Electrochem. Soc., vol. 141, No. 8, pp. 2172-2177, Aug. 1994.

Lassig, Stephan E. et al., "Intermetal Dielectric Deposition By Electron Cyclotron Resonance Chemical Vapor Deposition (ECR CVD)," pp. cover and 1-21, no date.

Li, Junling et al., "Modeling Studies Of The Mechanisms In Biased ECR CVD," 3 pages, no date.

Machida, Katsuyuki et al., "SiO2 Planarization Technology With Biasing And Electron Cyclotron Resonance Plasma Deposition For Submicron Interconnections," J Vac. Sci. Technol. B, vol. 4, No. 4, pp. 818-821, Jul./Aug. 1986.

* cited by examiner

LIMITED THERMAL BUDGET FORMATION OF PMD LAYERS

CROSS-REFERENCES TO RELATED APPLICATIONS

This application is a continuation-in-part of and claims the benefit of co-pending, commonly assigned U.S. patent application Ser. No. 10/247,672, entitled, "METHOD USING TEOS RAMP-UP DURING TEOS/OZONE CVD FOR IMPROVED GAP FILL," filed on Sep. 19, 2002, by Nitin K. Ingle, et al., the entire disclosure of which is herein incorporated by reference for all purposes.

BACKGROUND OF THE INVENTION

The fabrication sequence of integrated circuits often includes several patterning processes. The patterning processes may define a layer of conductors, such as a patterned metal or polysilicon layer, or may define isolation structures, such as trenches. In many cases the trenches are filled with an insulating, or dielectric, material. This insulating material can serve several functions. For example, in some applications the material serves to both electrically isolate one region of the IC from another, and electrically passivate the surface of the trench. The material also typically provides a base for the next layer of the semiconductor structure to be built upon.

As semiconductor design has advanced, the feature size of semiconductor devices has dramatically decreased. Many circuits now have features, such as traces or trenches, less than a micron across. While the reduction in feature size has allowed higher device density, more chips per wafer, more complex circuits, lower operating power consumption and lower cost, among other benefits, the smaller geometries have also given rise to new problems, or have resurrected problems that were once solved for larger geometries.

An example of the type of manufacturing challenge presented by sub-micron devices is the ability to completely fill a narrow trench in a void-free manner. To fill a trench with silicon oxide, a layer of silicon oxide is first deposited on the patterned substrate. The silicon oxide layer typically covers the field, as well as walls and bottom of the trench. If the trench is wide and shallow, it is relatively easy to completely fill the trench. As the trench gets narrower and the aspect ratio (the ratio of the trench height to the trench width) increases, it becomes more likely that the opening of the trench will "pinch off".

Pinching off a trench may trap a void within the trench. Voids resulting from pinching-off are undesirable as they can reduce the yield of good chips per wafer and the reliability of the devices. Under certain conditions, the void will be filled during a reflow process, for example where the deposited silicon oxide is doped and experiences viscous flow at elevated temperatures. However, as the trench becomes narrower, it becomes more likely that the void will not be filled during the reflow process. Moreover, several types of applications call for the deposition of undoped silicon oxide, which is difficult to reflow even at elevated temperature.

One possible solution to this problem is to anneal the oxide layer at high temperatures. Although successful in the past, this solution is no longer applicable in certain situations. New materials, such as nickel silicide, used in advanced semiconductor designs, have lowered thermal budgets, thus rendering some temperature/duration ranges of annealing unfeasible.

Therefore, it is desirable to be able to fill narrow gaps with dielectric material in a void-free manner. It is also desirable to do so without exceeding a thermal budget.

BRIEF SUMMARY OF THE INVENTION

Embodiments of the invention thus provide a method of filling a gap defined by adjacent raised features on a substrate. The method includes providing a flow of a silicon-containing processing gas to a chamber housing the substrate, providing a flow of an oxidizing processing gas to the chamber, and providing a flow of a phosphorous-containing processing gas to the chamber. The method also includes depositing a first portion of a P-doped silicon oxide film as a substantially conformal layer in the gap by causing a reaction between the silicon-containing processing gas, the phosphorous-containing processing gas, and the oxidizing processing gas. Depositing the conformal layer includes varying over time a ratio of the (silicon-containing processing gas plus phosphorous-containing processing gas):(oxidizing processing gas) and maintaining the temperature of the substrate below about 500° C. throughout deposition of the conformal layer. The method also includes depositing a second portion of the P-doped silicon oxide film as a bulk layer. Depositing a second portion of the film includes maintaining the ratio of the (silicon-containing processing gas plus phosphorous-containing processing gas):(oxidizing processing gas) substantially constant throughout deposition of the bulk layer and maintaining the temperature of the substrate below about 500° C. throughout deposition of the bulk layer. In some embodiments, the method includes patterning metal lines on the substrate over the P-doped silicon oxide layer and maintaining the temperature of the substrate below a reflow temperature of the P-doped silicon oxide layer from a point in time immediately after deposition of the bulk layer to a point in time after patterning metal lines on the substrate.

In other embodiments, a method of filling a gap defined by adjacent raised features on a substrate includes providing a flow of a silicon-containing processing gas to a chamber housing the substrate and providing a flow of an oxidizing processing gas to the chamber. The method also includes depositing a first portion of a silicon oxide film as a substantially conformal layer in the gap by causing a reaction between the silicon-containing processing gas and the oxidizing processing gas. Depositing the conformal layer includes varying over time a ratio of the (silicon-containing processing gas):(oxidizing processing gas). The method also includes maintaining the temperature of the substrate below about 500° C. throughout deposition of the conformal layer. The method also includes depositing a second portion of the silicon oxide film as a bulk layer. Depositing a second portion of the film includes maintaining the ratio of the (silicon-containing processing gas):(oxidizing processing gas) substantially constant throughout deposition of the bulk layer and maintaining the temperature of the substrate below about 500° C. throughout deposition of the bulk layer. The method also includes depositing a cap layer comprising a P-doped silicon oxide film while maintaining the substrate below about 500° C. throughout deposition of the cap layer.

In additional embodiments, a method is provided for processing a semiconductor substrate. The method includes providing a flow of a silicon-containing process gas to a chamber housing the substrate and providing a flow of an oxidizer process gas to the chamber. The method also includes causing a reaction between the silicon-containing process gas and the oxidizing process gas to form a silicon oxide layer on the substrate. The method further includes varying over time a ratio of the (silicon-containing gas):(oxidizing gas) flowed into the chamber to alter a rate of deposition of the silicon oxide on the substrate. During the process, the temperature of the substrate is maintained at or below a reflow temperature of the silicon oxide layer.

In some embodiments the silicon oxide layer may be a pre-metal dielectric layer. The substrate may include nickel silicide. The method may include providing a flow of a phosphorous-containing process gas to the chamber during a time period. The flow of silicon-containing process gas is provided at least partly during the time period. The silicon-containing process gas may include TEOS and the phosphorous-containing process gas may include TEPO.

In some embodiments the method includes thereafter providing a subsequent flow of phosphorous-containing process gas to the chamber. The method also may include, while providing the subsequent flow of phosphorous-containing process gas to the chamber, regulating a pressure of the chamber to a pressure in a range from about 200 torr to about 760 torr. The method also may include, while providing the subsequent flow of phosphorous-containing process gas to the chamber, forming a plasma from the phosphorous-containing process gas. The plasma may have a density greater than about $10^{11}$ ions/cm$^3$.

In still other embodiments, a method of processing a semiconductor substrate includes providing a flow of a silicon-containing process gas to a chamber housing the substrate, providing a flow of an oxidizing process gas to the chamber, and providing a flow of a phosphorous-containing process gas to the chamber. The method also includes causing a reaction between the silicon-containing process gas, the oxidizing process gas, and the phosphorous-containing gas to form a P-doped silicon oxide layer on the substrate. The method also includes varying over time a ratio of the (silicon-containing gas):(oxidizing gas):(phosphorous-containing gas) flowed into the chamber to alter a rate of deposition of the silicon oxide on the substrate. During the process, the temperature of the substrate is maintained at or below a temperature of 500° C.

In some embodiments, the P-doped silicon oxide layer comprises a pre-metal dielectric layer. The substrate may include nickel silicide. The silicon-containing process gas may include TEOS and the phosphorous-containing process gas may include TEPO.

In still other embodiments the method includes thereafter providing a subsequent flow of phosphorous-containing process gas to the chamber. The method may include, while providing the subsequent flow of phosphorous-containing process gas to the chamber, regulating a pressure of the chamber to a pressure in a range from about 200 torr to about 760 torr. The method also may include, while providing the subsequent flow of phosphorous-containing process gas to the chamber, forming a plasma from the phosphorous-containing process gas. The plasma may have a density greater than about $10^{11}$ ions/cm$^3$.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components.

DETAILED DESCRIPTION OF THE INVENTION

Embodiments of the present invention provide methods, apparatuses, and devices related to chemical vapor deposition of silicon oxide particularly suitable for the formation of pre-metal dielectric (PMD) layers. In one embodiment, a process is used to form an undoped silicon oxide (sometimes referred to a undoped silicate glass, "USG") conformal layer followed by a P-doped silicon oxide (sometimes referred to as P-doped silicate glass, "PSG") cap layer. During a first chemical vapor deposition (CVD) phase, silicon-containing gas and oxidizer gas are flowed while varying the ratio of the two, resulting in the formation of silicon oxide exhibiting a highly conformal character with good gap-filling properties. The PSG is then formed in a subsequent CVD phase. In other embodiments, a PSG conformal layer is formed by varying a ratio of (silicon-containing process gas):(phosphorous-containing process gas):(oxidizing process gas). In some such embodiments, a PSG cap layer may not be included. In both embodiments, however, the layers do not require an anneal process, thus avoiding steps that may risk exceeding a thermal budget. Aspects of the present invention are best understood with reference to the limitations of conventional processes.

I. Introduction

Figure 1:
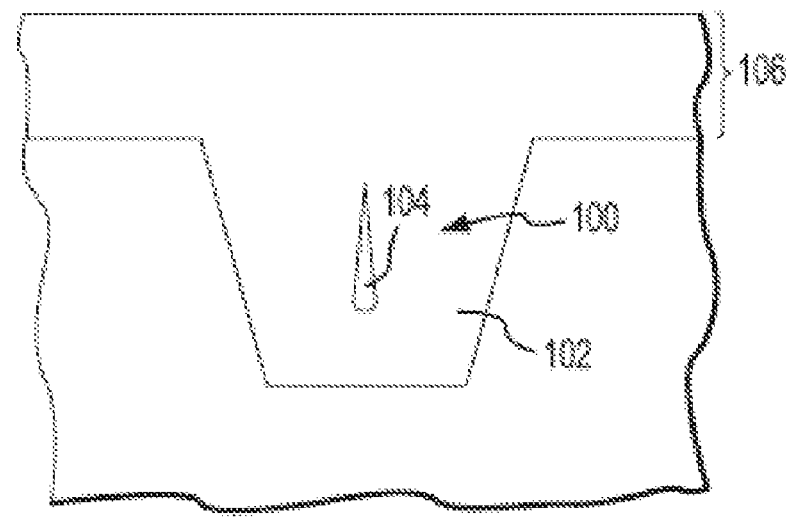
FIG. 1 shows a simplified cross-sectional view of a trench filled with oxide utilizing conventional deposition techniques.

FIG. 1 shows a simplified cross-sectional view of an example of trench 100 filled with silicon oxide 102 deposited utilizing a conventional process. FIG. 1 shows that the increased rate of deposition of oxide material on the raised edges of the trench 100 has resulted in pinching-off of the trench and created unwanted void or pinhole defect 104 within the feature. Void 104 can adversely affect the operation of a semiconductor device that is relying upon the consistent dielectric strength of the oxide-filled trench.

The oxide-filled trench 100 may form part of a PMD structure. Traditionally, boron- and phosphorous-doped silicate glass (BPSG) formed in a sub-atmospheric chemical vapor deposition (SACVD) process has been used for PMD. Such films, however, typically require a high temperature anneal that takes the oxide beyond a glass transition temperature and allows it to reflow, thus removing voids, in most cases. The use of modern materials, such as nickel silicide, (used, for example, in connectors) are incompatible with high temperature anneal processes as their inclusion in an integrated circuit may require that the substrate upon which the circuit is fabricated not be subjected to temperatures above 500° C.

Figure 2:
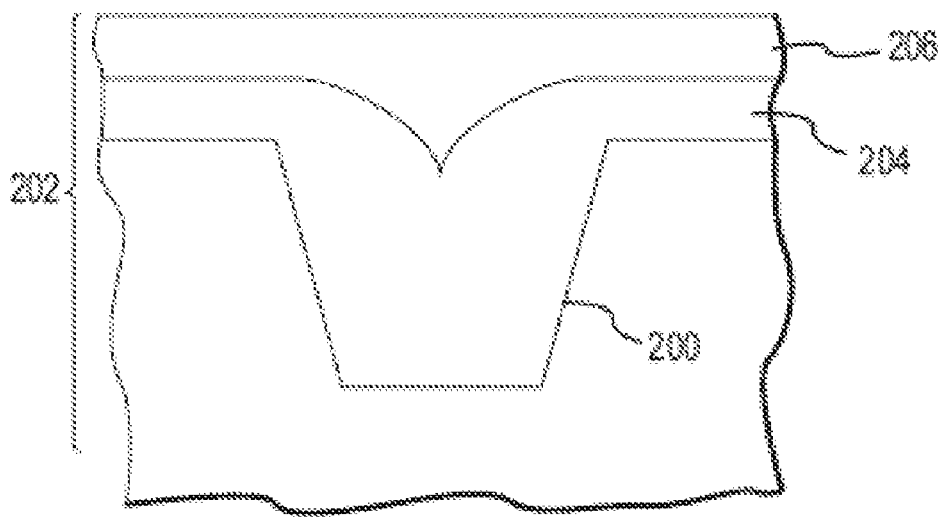
FIG. 2 shows a simplified cross-sectional view of an oxide-filled trench in accordance with embodiments of the present invention.

FIG. 1 is to be contrasted with FIG. 2, which shows a simplified cross-sectional view of a trench structure 200 having an oxide layer 202 formed utilizing a process in accordance with an embodiment of the invention. In some embodiments, the oxide-filled trench is part of a PMD structure. The oxide layer may comprise a conformal layer 204 and a cap layer 206. The conformal layer 204 may comprise an undoped oxide or a P-doped oxide. In some embodiments, the conformal layer 204 may be formed by varying a ratio of (silicon-containing process gas):(oxidizing process gas), as will be described in more detail hereinafter. In some embodiments, the conformal layer is formed by varying a ratio of (silicon-containing process gas):(phosphorous-containing process gas):(oxidizing process gas). The cap layer 206 may comprise PSG as a gettering layer. The PSG may be formed in a SACVD PSG process, a plasma-enhanced CVD (PECVD) PSG process, a high density CVD (HDCVD) PSG process, or similar process, as will be described hereinafter. In a specific embodiment relating to PMD, the conformal layer 204 comprises a P-doped oxide, and the cap layer is not be included.

The oxide-filled trench 200 of FIG. 2 does not include voids or weak seams associated with similar features formed utilizing conventional processes. Moreover, the oxide-filled trench 200 is formed without compromising a thermal budget.

II. Exemplary Deposition Processes

Figure 3:
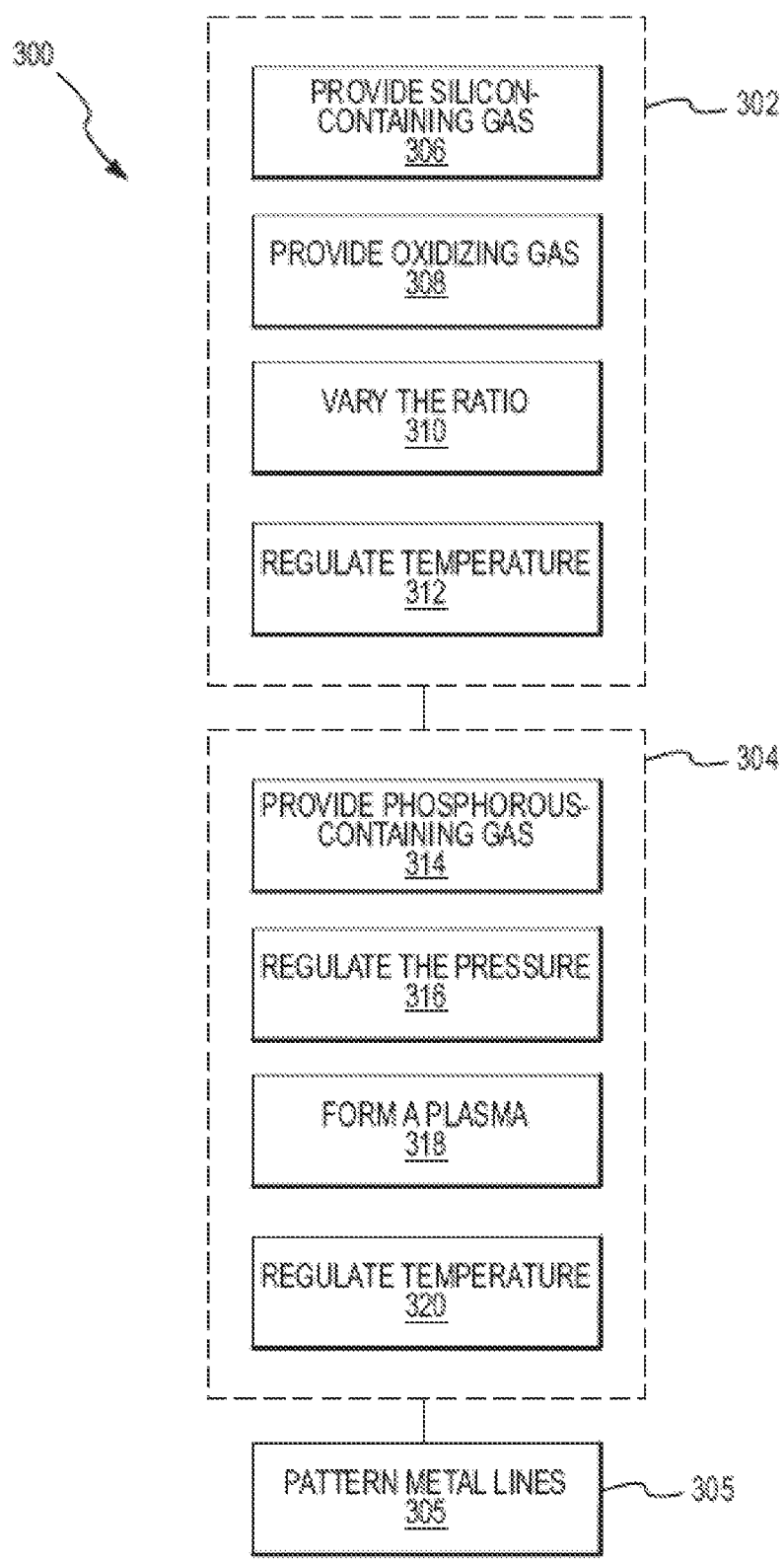
FIG. 3 illustrates a first deposition process according to embodiments of the invention.

Having described embodiments of the invention generally, attention is directed to FIG. 3, which illustrates a first deposition process 300 according to an embodiment of the invention. The process 300 may be used to deposit a PMD or other layer. The process may take place in a CVD chamber, one example of which will be described hereinafter. The process 300 comprises conformal layer deposition 302 and cap layer deposition 304. In some embodiments, metal lines are patterned over the cap layer at block 305.

In a specific embodiment, the silicon-containing process gas comprises tetraethylorthosilicate (TEOS); however, other silicon-containing process gases such as $SiH_4$, $S_2H_6$, $S_3H_8$, etc., may be used. Also in a specific embodiment, the oxidizing process gas comprises ozone ($O_3$), although oxidizing gases such as $O_2$, $H_2O$, $H_2O_2$ may alternatively be used. Furthermore, this embodiment of the invention is described for gapfill using USG, but it will be appreciated that in alternative embodiments the film may be doped, as will be described below with reference to FIG. 4.

Conformal layer deposition 302 may be performed according to the process described in more detail in previously-incorporated U.S. patent application Ser. No. 10/247,672. The process includes flowing a silicon-containing process gas 306 and an oxidizing process gas 308. The ratio (silicon-containing gas):(oxidizer-containing gas) is varied 310, thereby varying the rate at which the conformal layer is deposited and possibly the composition of the conformal layer. For example, at the start of the process the concentration of the silicon-containing gas in the mixture may be small, then may be increased as the film thickness increases. In such examples, conformal layer deposition 302 may comprise depositing a conformal layer during a phase in which the silicon-containing gas concentration in the mixture is small, then depositing a bulk layer during a phase in which the silicon-containing gas concentration in the mixture is higher.

The temperature of the substrate is regulated 312, in some cases in both degree and duration, such that a thermal budget is not exceeded. Regulating the temperature 312 may take place during conformal layer deposition 302, cap layer deposition 304, and/or patterning metal lines 305. In some embodiments, this comprises maintaining the temperature below about 500° C. throughout processing of the substrate. In some embodiments this comprises not annealing any layer of the substrate.

Cap layer deposition 304 may take place in situ. For example, if conformal layer deposition 302 takes place in a CYD chamber, then cap layer deposition 304 may take place in the same chamber immediately thereafter. Cap layer deposition 304 alternatively may take place ex situ by forming the cap layer in another chamber of a multi-chamber system or by forming it in a different chamber system. Cap layer deposition 302 comprises flowing a phosphorous-containing gas 314. In some embodiments, the phosphorous-containing gas comprises triethylphosphate (TEPO) or $PH_3$. Cap layer deposition 304 also may include flowing a silicon-containing process gas and an oxidizing process gas as described above for conformal layer deposition 302.

Cap layer deposition 304 also may include regulating the pressure of the deposition environment 316, and/or forming a plasma in the environment 318. In some embodiments, the plasma environment is a high density plasma environment, which is defined as having an ion intensity greater than $10^{11}$ ions/cm$^3$. The phosphorous concentration during cap layer deposition may range from about 7% to about 9% by weight in some embodiments and from about 3.5 to 4% by weight in other embodiments. Other embodiments comprise phosphorous concentrations in the range from about 1% to about 10% by weight. As stated above, cap layer deposition may include regulating the temperature of the substrate 320.

Figure 4:
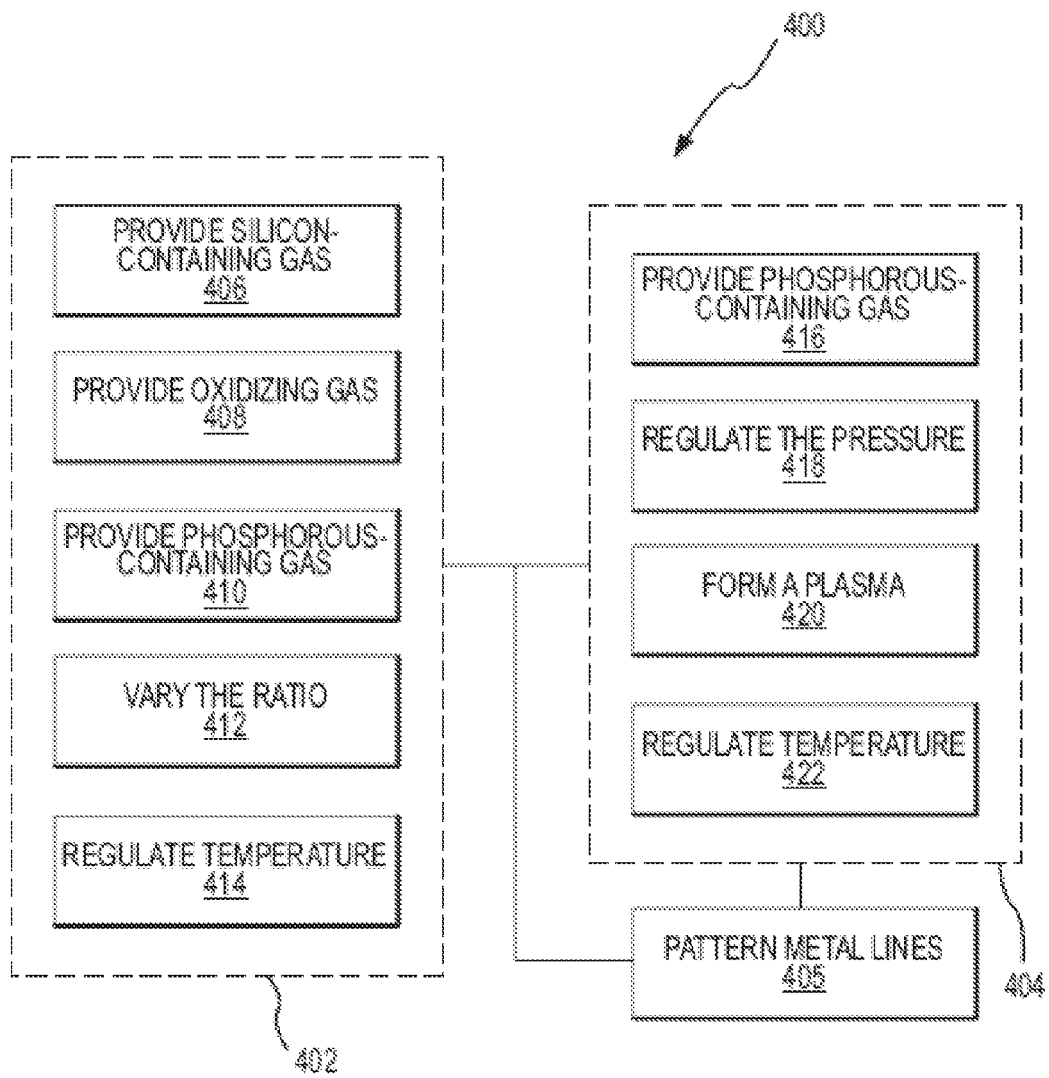
FIG. 4 illustrates a second deposition process according to embodiments of the invention.

FIG. 4 illustrates a second deposition process 400 according to an embodiment of the invention. The process may be used, for example, to deposit a PSG PMD layer on a substrate. The process includes conformal layer deposition 402 and may include cap layer deposition 404. The process also may include patterning metal lines 405.

Conformal layer deposition 402 includes providing a silicon-containing process gas 406, an oxidizing process gas 408, and a phosphorous-containing process gas 410. The silicon-containing process gas may comprises tetraethylorthosilicate (TEOS) or other silicon-containing gases, such as $SiH_4$, $S_2H_6$, $S_3H_8$. The oxidizing process gas may comprises ozone ($O_3$), $O_2$, $H_2O$, $H_2O_2$ or the like. In a specific embodiment, the phosphorous-containing gas comprises TEPO. Although this embodiment relates to depositing a P-doped conformal layer, additional dopants also may be used. For example, a flow of $SiF_4$ may be used to fluorinate the film, a flow of $PH_3$ may be used to phosphorate the film, a flow of $B_2H_6$ may be used to boronate the film, a flow of $N_2$ may be used to nitrogenate the film, and the like.

As described in more detail with respect to conformal layer deposition 302 above, the ratio of the three gases may be varied 412 to regulate the rate of deposition, for example, by maintaining the oxidizing process gas at a higher concentration at the beginning of the process and lowering the concentration of the oxidizing process gas as the film thickness increases. This may be accomplished by either decreasing the flow rate of the oxidizing process gas and/or increasing the flow rate of the other gases. The concentrations of the silicon-containing gas and/or the dopant gas may be similarly regulated.

The temperature also may be regulated 414 in both degree and duration such that a thermal budget is not exceeded. As described above, regulating the temperature 414 may take place during conformal layer deposition 402, cap layer deposition 404, and/or patterning metal lines 405. In some embodiments, this comprises maintaining the temperature below about 500° C. throughout processing of the substrate. In some embodiments this comprises not annealing any layer of the substrate. If desired, cap layer deposition 404 proceeds as previously described for cap layer deposition 304 of FIG. 3, which includes providing a phosphorous-containing gas 416, regulating the pressure 418, in some embodiments forming a plasma 420, and regulating the temperature 422.

The deposition steps 302, 304, 402, 404 may comprise an SACVD process. In such a process, while the temperature profile may be regulated so as to remain within a thermal budget, it should be noted that the gapfill process tends to be more successful at higher temperatures. With high aspect ratio narrow gaps, greater success is achieved by varying the ratio (silicon-containing process gas):(oxidizing gas), beginning with a lower concentration of silicon-containing process gas, as described above and more fully in previously-incorporated U.S. patent application Ser. No. 10/247,672. The process may be further aided by disbursing the gas uniformly across the substrate. As the concentration of silicon-containing process gas in the mixture increases, the gas may be disbursed closer to the surface of the substrate. This technique and an apparatus for practicing it are more fully described in co-pending, commonly assigned U.S. patent application Ser. No. 10/057,280, filed on Jan. 25, 2002, entitled "GAS DISTRIBUTION SHOWERHEAD," and/or co-pending, commonly assigned U.S. patent application Ser. No. 10/674,569, filed on Sep. 29, 2003, entitled "GAS DISTRIBUTION SHOWERHEAD," the entire disclosure of each of which are herein incorporated by reference. The combination of varying the processing gas ratios and disbursing the gases at varying distances from the wafer produce better gapfill that, in most cases, requires no annealing.

Alternative embodiments of the previously-described processes may include more or fewer operations. Further, the operations in alternative embodiments are not necessarily performed in the order depicted, as is apparent to those skilled in the art in light of the disclosure herein.

III. An Exemplary Deposition System

Figure 5A:
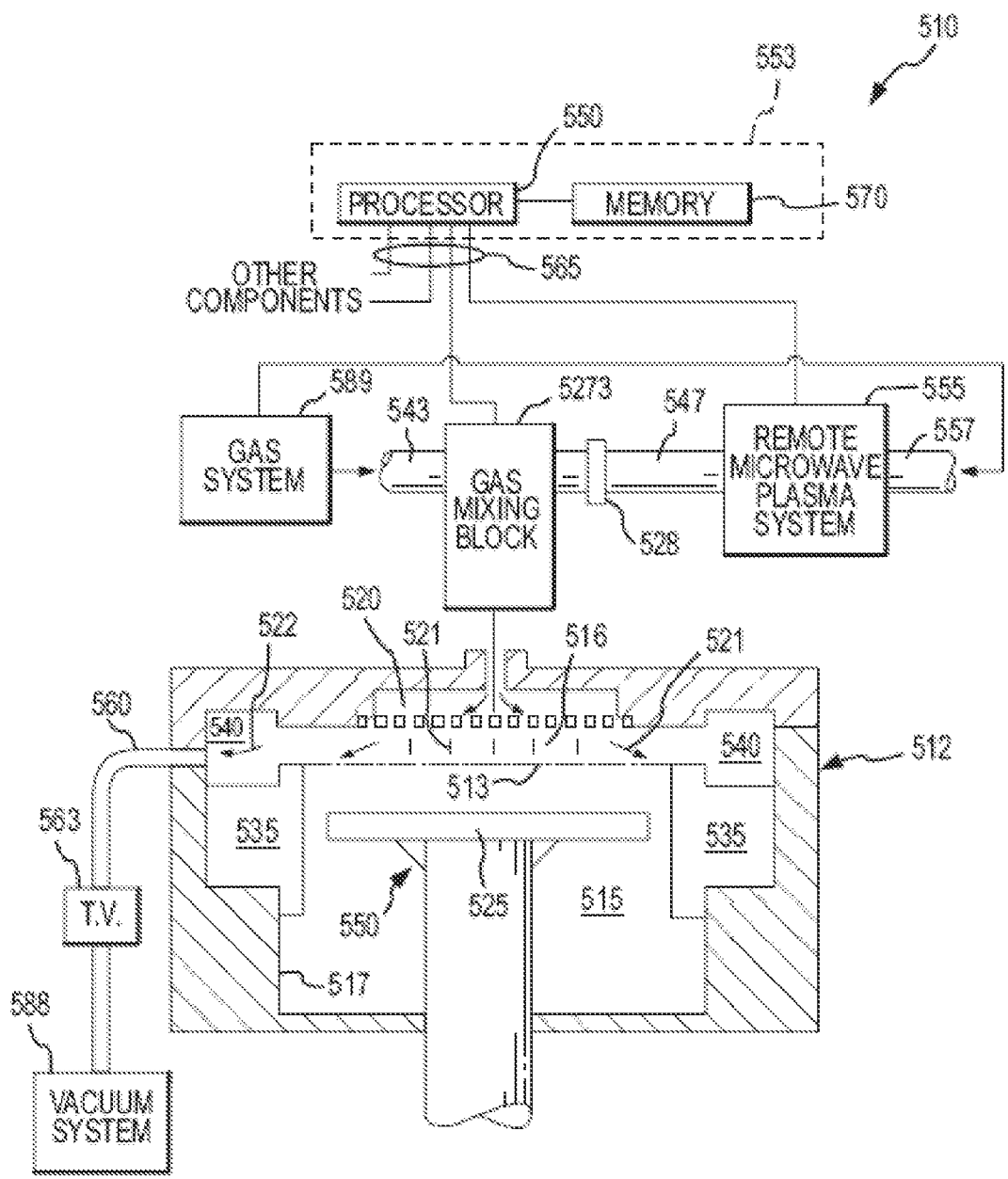
FIG. 5A is a simplified representation of a CVD apparatus according to an embodiment of the present invention.

Having described methods according to embodiments of the present invention, attention is directed to FIG. 5A, which illustrates a simplified diagram of a CVD system 510 according to an embodiment of the present invention. This system is suitable for performing thermal, SACVD processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 515 that receives process and other gases from a gas delivery system 589, a vacuum system 588, a remote microwave plasma system 555, and a control system 553. These and other components are described below in order to understand the present invention.

The CVD apparatus 510 includes an enclosure assembly 512 housing a vacuum chamber 515 with a gas reaction area 516. A gas distribution plate 520 is provided above the gas reaction area 516 for dispersing reactive gases and other gases, such as purge gases, through perforated holes in the gas distribution plate 520 to a wafer (not shown) that rests on a vertically movable heater 525 (also referred to as a wafer support pedestal). The heater 525 can be controllably moved between a lower position, where a wafer can be loaded or unloaded, for example, and a processing position closely adjacent to the gas distribution plate 520, indicated by a dashed line 513, or to other positions for other purposes, such as for an etch or cleaning process. A center board (not shown) includes sensors for providing information on the position of the wafer.

In some embodiments, the gas distribution plate 520 may be of the variety described in either of previously-incorporated U.S. patent application Ser. No. 10/057,280 or 10/674,569. These plates improve the uniformity of gas disbursement at the substrate and are particularly advantageous in deposition processes that vary gas concentration ratios. In some examples, the plates work in combination with the vertically moveable heater 525 (or moveable wafer support pedestal) such that deposition gases are released farther from the substrate when the ratio is heavily skewed in one direction (e.g., when the concentration of a silicon-containing gas is small compared to the concentration of an oxidizer-containing gas) and are released closer to the substrate as the concentration changes (e.g., when the concentration of silicon-containing gas in the mixture is higher). In other examples, the orifices of the gas distribution plate are designed to provide more uniform mixing of the gases.

The heater 525 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 525 exposed to the vacuum chamber 515 are made of a ceramic material, such as aluminum oxide ($Al_2O_3$ or alumina) or aluminum nitride.

Reactive and carrier gases are supplied through the supply line 543 into a gas mixing box (also called a gas mixing block) 527, where they are preferably mixed together and delivered to the gas distribution plate 520. The gas mixing box 527 is preferably a dual input mixing block coupled to a process gas supply line 543 and to a cleaning/etch gas conduit 547. A valve 528 operates to admit or seal gas or plasma from the gas conduit 547 to the gas mixing block 527. The gas conduit 547 receives gases from an integral remote microwave plasma system 555, which has an inlet 557 for receiving input gases. During deposition processing, gas supplied to the plate 520 is vented toward the wafer surface (as indicated by arrows 521), where it may be uniformly distributed radially across the wafer surface, typically in a laminar flow.

Purging gas may be delivered into the vacuum chamber 515 from the plate 520 and/or an inlet port or tube (not shown) through the bottom wall of enclosure assembly 512. The purging gas flows upward from the inlet port past the heater 525 and to an annular pumping channel 540. An exhaust system then exhausts the gas (as indicated by arrows 522) into the annular pumping channel 540 and through an exhaust line 560 to a vacuum system 588, which includes a vacuum pump (not shown). Exhaust gases and entrained particles are drawn from the annular pumping channel 540 through the exhaust line 560 at a rate controlled by a throttle valve system 563.

The remote microwave plasma system 555 can produce a plasma for selected applications, such as chamber cleaning or etching native oxide or residue from a process wafer. Plasma species produced in the remote plasma system 555 from precursors supplied via the input line 557 are sent via the conduit 547 for dispersion through the plate 520 to the vacuum chamber 515. Precursor gases for a cleaning application may include fluorine, chlorine, and other reactive elements. The remote microwave plasma system 555 also may be adapted to deposit plasma-enhanced CVD films by selecting appropriate deposition precursor gases for use in the remote microwave plasma system 555.

The system controller 553 controls activities and operating parameters of the deposition system. The processor 550 executes system control software, such as a computer program stored in a memory 570 coupled to the processor 550. Preferably, the memory 570 may be a hard disk drive, but of course the memory 570 may be other kinds of memory, such as read-only memory or flash memory. In addition to a hard disk drive (e.g., memory 570), the CVD apparatus 510 in a preferred embodiment includes a floppy disk drive and a card rack (not shown).

The processor 550 operates according to system control software programmed to operate the device according to the methods disclosed herein. For example, sets of instructions may dictate the timing, mixture of gases, chamber pressure, chamber temperature, microwave power levels, susceptor position, and other parameters of a particular process. Other computer programs such as those stored on other memory including, for example, a floppy disk or another computer program product inserted in a disk drive or other appropriate drive, may also be used to operate the processor 550 to configure the CVD system 510 into various apparatus.

The processor 550 has a card rack (not shown) that contains a single-board computer, analog and digital input/output boards, interface boards and stepper motor controller boards. Various parts of the CVD system 510 conform to the Versa Modular European (VME) standard which defines board, card cage, and connector dimensions and types. The VME standard also defines the bus structure having a 16-bit data bus and 24-bit address bus.

Figure 5B:
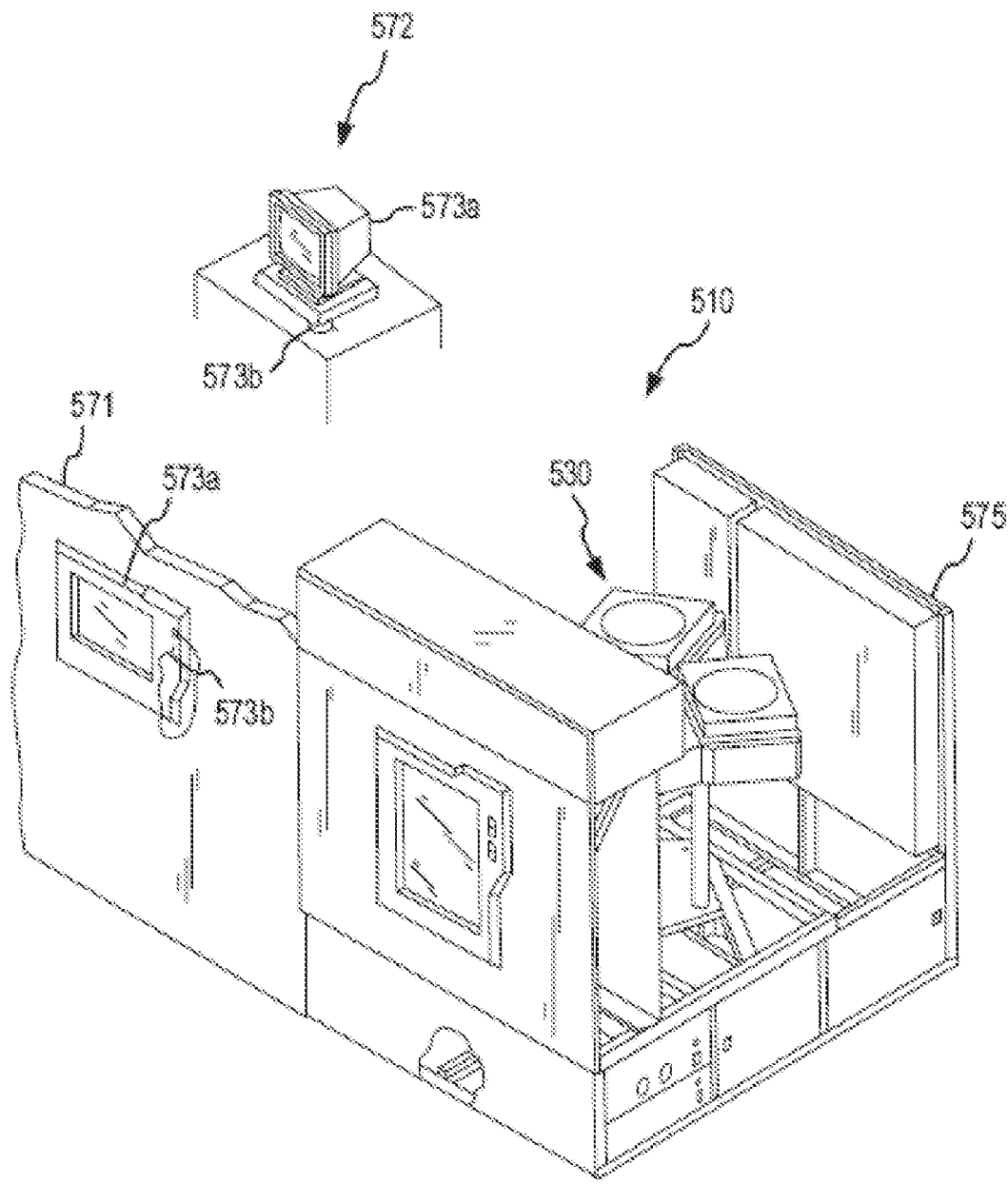
FIG. 5B is a simplified representation of the user interface for a CVD system in relation to a deposition chamber in a multi-chamber system.

FIG. 5B is a simplified diagram of a user interface in relation to the CVD apparatus chamber 530. The CVD apparatus 510 includes one chamber of a multichamber system. Wafers may be transferred from one chamber to another for additional processing. In some cases the wafers are transferred under vacuum or a selected gas. The interface between a user and the processor is via a CRT monitor 573a and a light pen 573b. A mainframe unit 575 provides electrical, plumbing, and other support functions for the CVD apparatus 510. Exemplary mainframe units compatible with the illustrative embodiment of the CVD apparatus are currently commercially available as the PRECISION 5000™, the CENTURA 5200™, and the PRODUCER SE™ systems from APPLIED MATERIALS, INC. of Santa Clara, Calif.

In some embodiments two monitors 573a are used, one mounted in the clean room wall 571 for the operators, and the other behind the wall 572 for the service technicians. Both monitors 573a simultaneously display the same information, but only one light pen 573b is enabled. The light pen 573b detects light emitted by the CRT display with a light sensor in the tip of the pen. To select a particular screen or function, the operator touches a designated area of the display screen and pushes the button on the pen 573b. The touched area changes its highlighted color, or a new menu or screen is displayed, confirming communication between the light pen and the display screen. Of course, other devices, such as a keyboard, mouse, or other pointing or communication device, may be used instead of or in addition to the light pen 573b to allow the user to communicate with the processor.

Figure 5C:
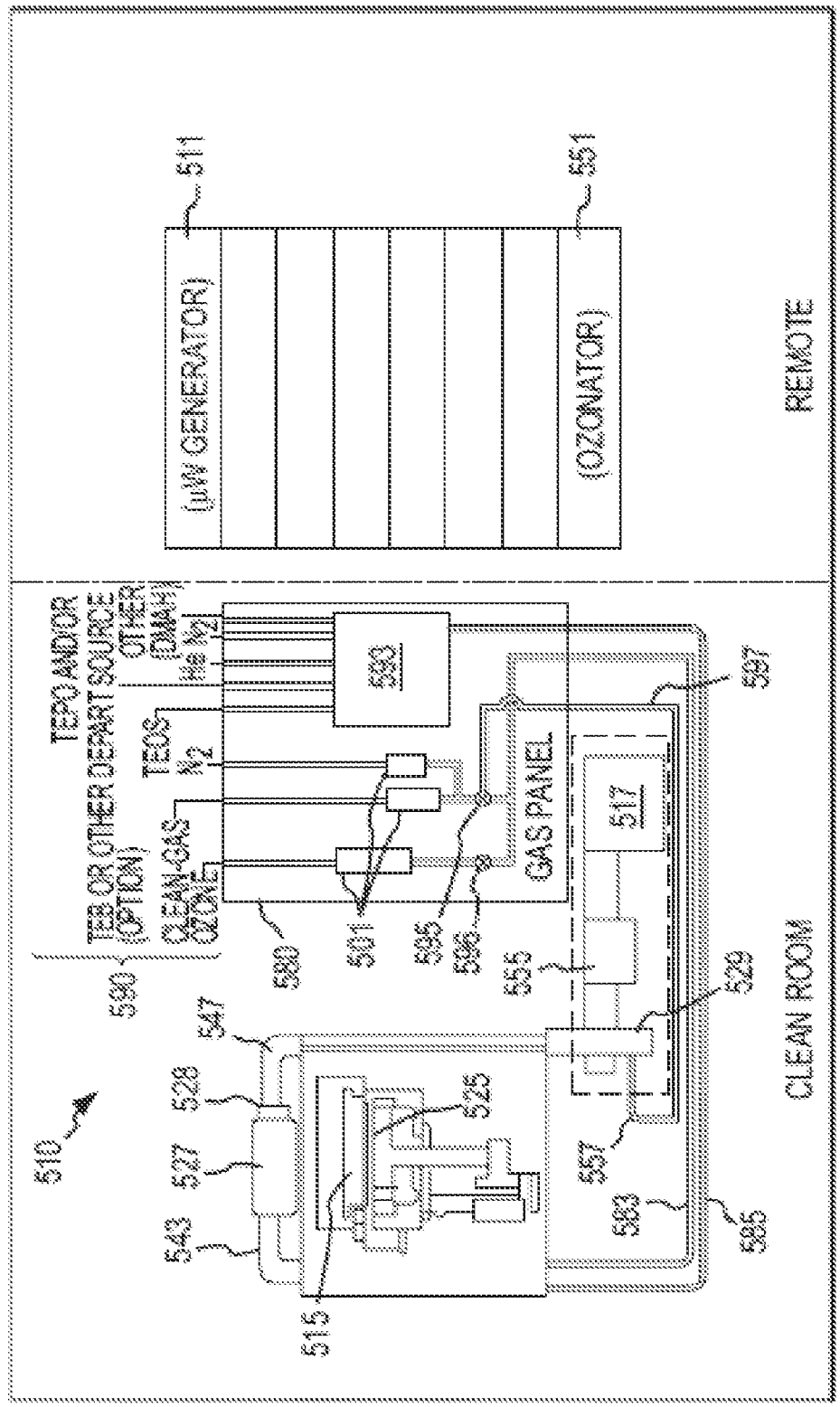
FIG. 5C is a simplified diagram of a gas panel and supply lines in relation to a deposition chamber.

FIG. 5C illustrates a general overview of an embodiment of the CVD apparatus 510 in relation to a gas supply panel 580 located in a clean room. As discussed above, the CVD system 510 includes a chamber 515 with a heater 525, a gas mixing box 527 with inputs from an inlet tube 543 and a conduit 547, and remote microwave-plasma system 555 with input line 557. As mentioned above, the gas mixing box 527 is for mixing and injecting deposition gas(es) and clean gas(es) or other gas(es) through the inlet tube 543 to the processing chamber 515.

The remote microwave plasma system 555 is integrally located and mounted below the chamber 515 with the conduit 547 coming up alongside the chamber 515 to the gate valve 528 and the gas mixing box 527, located above the chamber 515. Microwave generator 511 and ozonator 551 are located remote from the clean room. Supply lines 583 and 585 from the gas supply panel 580 provide reactive gases to the gas supply line 543. The gas supply panel 580 includes lines from gas or liquid sources 590 that provide the process gases for the selected application. The gas supply panel 580 has a mixing system 593 that mixes selected gases before flow to the gas mixing box 527. In some embodiments, gas mixing system 593 includes a liquid injection system for vaporizing reactant liquids such as tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 595 that can be used to automatically or manually shut off the flow of process gas into line 585 or line 557, and (ii) liquid flow meters (LFM) 501 or other types of controllers that measure the flow of gas or liquid through the supply lines.

As an example, a mixture including TEOS as a silicon source may be used with gas mixing system 593 in a deposition process for forming a silicon oxide film. The TEPO is a liquid source that may be vaporized by conventional boiler-type or bubbler-type hot boxes. However, a liquid injection system is preferred as it provides greater control of the volume of reactant liquid introduced into the gas mixing system. The liquid is typically injected as a fine spray or mist into the carrier gas flow before being delivered to a heated gas delivery line 585 to the gas mixing block and chamber. One or more sources, such as oxygen ($O_2$) or ozone ($O_3$) flow to the chamber through another gas delivery line 583, to be combined with the reactant gases from heated gas delivery line 585 near or in the chamber. Of course, it is recognized that other sources of dopants, silicon, and oxygen also may be used.

IV. Exemplary Semiconductor Structure

Figure 6:
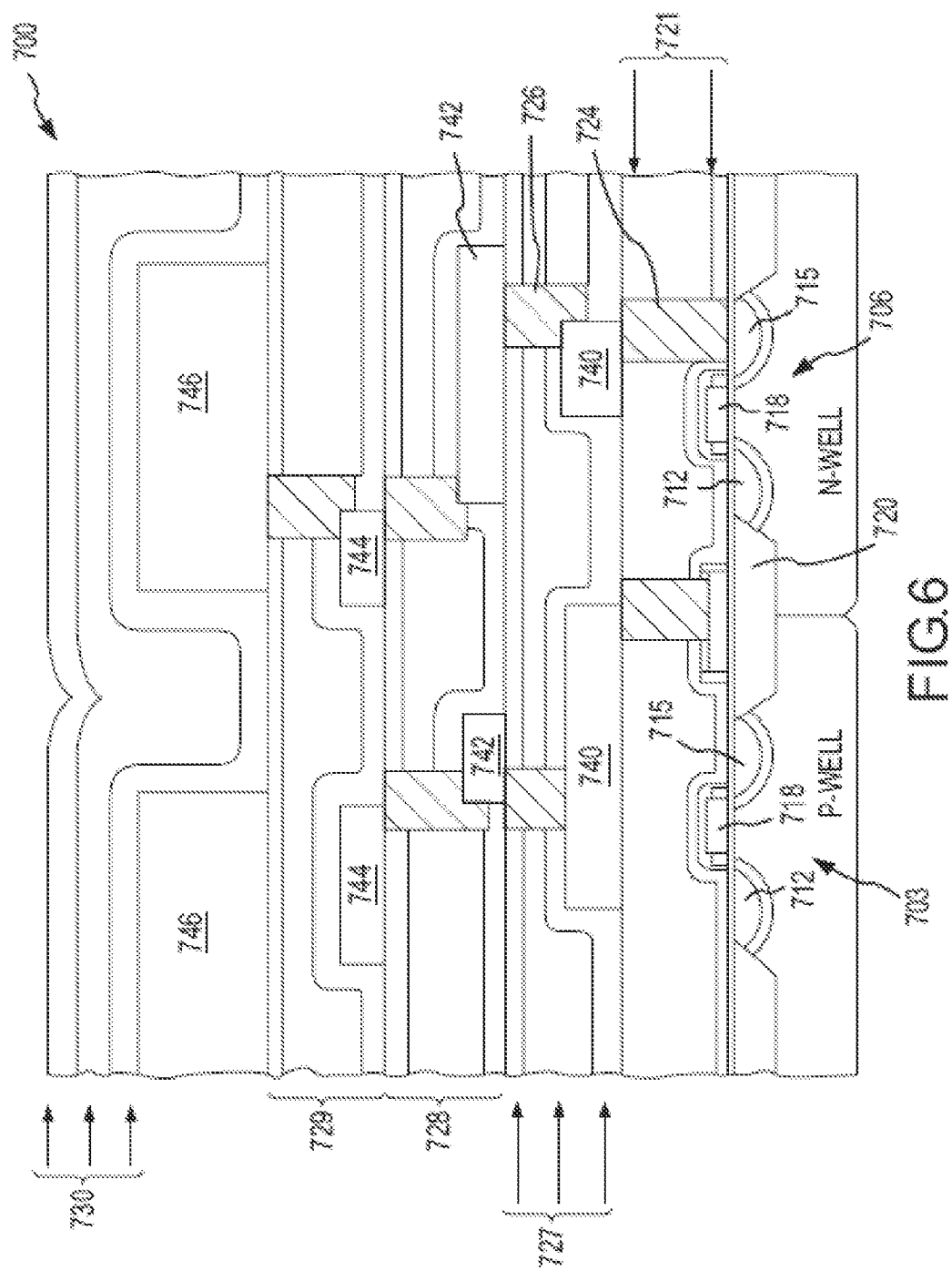
FIG. 6 is a simplified cross section of a portion of an integrated circuit according to embodiments of the present invention.

FIG. 6 illustrates a simplified cross-sectional view of an integrated circuit 700 according to an embodiment of the present invention. As shown in FIG. 7, the integrated circuit 700 includes NMOS and PMOS transistors 703 and 706, which are separated and electrically isolated from each other by oxide-filled trench isolation structure 720. Alternatively, field oxide isolation can be used to isolate devices, or a combination of isolation techniques may be used. Each of the transistors 703 and 706 comprises a source region 712, a gate region 715, and a drain region 718.

A premetal dielectric (PMD) layer 721 separates the transistors 703 and 706 from the metal layer 740, with connections between metal layer 740 and the transistors made by contacts 724. The premetal dielectric layer 721 may comprise a single layer or multiple layers. The metal layer 740 is one of four metal layers, 740, 742, 744, and 746, included in the integrated circuit 700. Each metal layer is separated from adjacent metal layers by intermetal dielectric layers 727, 728, and 729. Adjacent metal layers are connected at selected openings by vias 726. Planarized passivation layers 730 are deposited over the metal layer 746.

A silicon oxide layer deposited according to an embodiment of the present invention may be used to form one or more of the dielectric layers shown in integrated circuit 700. For example, a silicon oxide layer may be used to create trench isolation structure 720. A silicon oxide layer deposited according to the present invention may also be used to create PMD layer 721, or the higher layer intermetal dielectric layers 727-729 of the overlying interconnect structure.

A silicon oxide layer deposited according to an embodiment of the present invention may also be used in damascene layers, which are included in some integrated circuits. In damascene layers, a blanket layer is deposited over a substrate, selectively etched through to the substrate, and then filled with metal and etched back or polished to form metal contacts 724. After the metal layer is deposited, a second blanket deposition is performed and selectively etched. The etched areas are then filled with metal and etched back or polished to form vias 726.

It should be understood that the simplified integrated circuit 700 is for illustrative purposes only. One of ordinary skill in the art could implement the present method for fabrication of other integrated circuits, such as microprocessors, application-specific integrated circuits (ASICs), memory devices, and the like.

Having described several embodiments, it will be recognized by those of skill in the art that various modifications, alternative constructions, and equivalents may be used without departing from the spirit of the invention. For example, although embodiments of the present invention have been described with respect to depositing a PMD layer, other embodiments may be directed toward depositing other layers. Additionally, a number of well known processes and elements have not been described in order to avoid unnecessarily obscuring the present invention. Accordingly, the above description should not be taken as limiting the scope of the invention, which is defined in the following claims.

What is claimed is:

1. A method of filling a gap defined by adjacent raised features on a substrate, comprising:
    providing a flow of a silicon-containing processing gas to a chamber housing the substrate;
    providing a flow of an oxidizing processing gas to the chamber;
    providing a flow of a phosphorous-containing processing gas to the chamber;
    depositing a first portion of a P-doped silicon oxide film as a substantially conformal layer in the gap by causing a reaction between the silicon-containing processing gas, the phosphorous-containing processing gas, and the oxidizing processing gas, wherein depositing the conformal layer comprises varying between a beginning and end of the depositing of the conformal layer, and throughout the depositing of the conformal layer a ratio of the (silicon-containing processing gas plus phosphorous-containing processing gas):(oxidizing processing gas) and maintaining the temperature of the substrate below about 500° C. throughout deposition of the conformal layer; and
    thereafter, depositing a second portion of the P-doped silicon oxide film as a bulk layer, wherein depositing a second portion of the film comprises maintaining the ratio of the (silicon-containing processing gas plus phosphorous-containing processing gas):(oxidizing processing gas) substantially constant throughout deposition of the bulk layer and maintaining the temperature of the substrate below about 500° C. throughout deposition of the bulk layer.

2. The method of claim 1, further comprising:
    thereafter, patterning metal lines on the substrate over the P-doped silicon oxide film; and
    maintaining the temperature of the substrate below a reflow temperature of the P-doped silicon oxide film from a point in time immediately after deposition of the bulk layer to a point in time after patterning metal lines on the substrate.

3. The method of claim 2, wherein maintaining the temperature of the substrate below a reflow temperature of the P-doped silicon oxide film from a point in time immediately after deposition of the bulk layer to a point in time after patterning metal lines on the substrate comprises not annealing any portion of the substrate.

4. The method of claim 1, wherein the substrate comprises nickel silicide connectors and the P-doped silicon oxide film comprises a pre-metal dielectric layer.

5. A method of filling a gap defined by adjacent raised features on a substrate, comprising:
    providing a flow of a silicon-containing processing gas to a chamber housing the substrate;
    providing a flow of an oxidizing processing gas to the chamber;
    depositing a first portion of a silicon oxide film as a substantially conformal layer in the gap by causing a reaction between the silicon-containing processing gas and the oxidizing processing gas, wherein depositing the conformal layer comprises varying between a beginning and end of the depositing of the conformal layer, and throughout the depositing of the conformal layer a ratio of the (silicon-containing processing gas):(oxidizing processing gas) and maintaining the temperature of the substrate below about 500° C. throughout deposition of the conformal layer;
    thereafter, depositing a second portion of the silicon oxide film as a bulk layer, wherein depositing a second portion of the film comprises maintaining the ratio of the (silicon-containing processing gas):(oxidizing processing gas) substantially constant throughout deposition of the bulk layer and maintaining the temperature of the substrate below about 500° C. throughout deposition of the bulk layer; and
    thereafter, depositing a cap layer comprising a P-doped silicon oxide film while maintaining the substrate below about 500° C throughout deposition of the cap layer.

6. The method of claim 5, further comprising:
    thereafter, patterning metal lines on the substrate over the P-doped silicon oxide film; and
    maintaining the temperature of the substrate below a reflow temperature of either the silicon oxide film or the P-doped silicon oxide film from a point in time immediately after deposition of the bulk layer to a point in time after patterning metal lines on the substrate.

7. The method of claim 6, wherein maintaining the temperature of the substrate below a reflow temperature of either the silicon oxide film or the P-doped silicon oxide film from a point in time immediately after deposition of the bulk layer to a point in time after patterning metal lines on the substrate comprises not annealing any portion of the substrate.

8. A method of processing a semiconductor substrate, comprising:
    providing a flow of a silicon-containing process gas to a chamber housing the substrate;
    providing a flow of an oxidizer process gas to the chamber;
    causing a reaction between the silicon-containing process gas and the oxidizing process gas to form a silicon oxide layer on the substrate;
    varying throughout the deposition of a substantially conformal layer a ratio of the (silicon-containing gas):(oxidizing gas) flowed into the chamber to alter a rate of deposition of the silicon oxide on the substrate between a beginning and end of the deposition of the substantially conformal layer; and
    maintaining the substrate at or below a reflow temperature of the silicon oxide layer throughout processing of the semiconductor substrate.

9. The method of claim 8, wherein maintaining the substrate at or below a reflow temperature of the silicon oxide layer throughout processing of the semiconductor substrate comprises not annealing the substrate.

10. The method of claim 8, wherein the silicon oxide layer comprises a pre-metal dielectric layer.

11. The method of claim 8, wherein the substrate comprises a gap between adjacent surfaces, and wherein the silicon oxide is deposited in the gap.

12. The method of claim 8, wherein the substrate comprises nickel silicide.

13. The method of claim 8, further comprising providing a flow of a phosphorous-containing process gas to the chamber during a time period, wherein the flow of silicon-containing process gas is provided at least partly during the time period.

14. The method of claim 13, wherein the silicon-containing process gas comprises TEOS and wherein the phosphorous-containing process gas comprises TEPO.

15. The method of claim 13, further comprising:
thereafter providing a subsequent flow of phosphorous-containing process gas to the chamber.

16. The method of claim 15, further comprising, while providing the subsequent flow of phosphorous-containing process gas to the chamber, regulating a pressure of the chamber to a pressure in a range from about 200 torr to about 760 torr.

17. The method of claim 15, further comprising, while providing the subsequent flow of phosphorous-containing process gas to the chamber, forming a plasma from the phosphorous-containing process gas.

18. The method of claim 17, wherein the plasma has a density greater than about 1011 ions/cm3.

19. A method of processing a semiconductor substrate, comprising:
providing a flow of a silicon-containing process gas to a chamber housing the substrate;
providing a flow of an oxidizing process gas to the chamber;
providing a flow of a phosphorous-containing process gas to the chamber;
causing a reaction between the silicon-containing process gas, the oxidizing process gas, and the phosphorous-containing gas to form a P-doped silicon oxide layer on the substrate; and
varying throughout the deposition of a substantially conformal layer a ratio of the (silicon-containing gas):(oxidizing gas):(phosphorous-containing gas) flowed into the chamber to alter a rate of deposition of the silicon oxide on the substrate between a beginning and end of the deposition of the substantially conformal layer.

20. The method of claim 19, further comprising maintaining the substrate at or below at reflow temperature of the P-doped silicon oxide layer.

21. The method of claim 19, wherein the substrate comprises a gap between adjacent surfaces, and wherein the silicon oxide is deposited in the gap.

22. The method of claim 19, wherein the P-doped silicon oxide layer comprises a pre-metal dielectric layer.

23. The method of claim 19, wherein the substrate comprises nickel silicide.

24. The method of claim 19, wherein the silicon-containing process gas comprises TEOS and wherein the phosphorous-containing process gas comprises TEPO.

25. The method of claim 24, further comprising:
thereafter providing a subsequent flow of phosphorous-containing process gas to the chamber.

26. The method of claim 25, further comprising, while providing the subsequent flow of phosphorous-containing process gas to the chamber, regulating a pressure of the chamber to a pressure in a range from about 200 torr to about 760 torr.

27. The method of claim 25, further comprising, while providing the subsequent flow of phosphorous-containing process gas to the chamber, forming a plasma from the phosphorous-containing process gas.

28. The method of claim 27, wherein the plasma has a density greater than about $10^{11}$ ions/cm$^3$.

* * * * *

UNITED STATES PATENT AND TRADEMARK OFFICE
CERTIFICATE OF CORRECTION

PATENT NO. : 7,431,967 B2  Page 1 of 1
APPLICATION NO. : 10/757770
DATED : October 7, 2008
INVENTOR(S) : Yuan et al.

It is certified that error appears in the above-identified patent and that said Letters Patent is hereby corrected as shown below:

Column 6, line 1, delete "CYD", and insert --CVD--.

Signed and Sealed this

Twentieth Day of January, 2009

JON W. DUDAS
*Director of the United States Patent and Trademark Office*